United States Patent [19]

Spirin et al.

[11] Patent Number: 4,954,771

[45] Date of Patent: Sep. 4, 1990

[54] STIMULUS GENERATOR

[76] Inventors: Jury L. Spirin, ulitsa Martenovskaya, 7, kv. 38; Jury M. Korbashov, ulitsa Taganskaya, 24, korpus 5, kv. 39; Konstantin V. Semin, shosse Entuziastov, 24/43, kv. 34; Alexandr S. Sigov, ulitsa Akademika Piljugina, 8, kv. 91, all of Moscow, U.S.S.R.

[21] Appl. No.: 249,351

[22] Filed: Sep. 23, 1988

[51] Int. Cl.⁵ ............................................. G01R 29/02
[52] U.S. Cl. ............................ 324/158 R; 324/150 D; 324/158 T; 361/108
[58] Field of Search ........... 324/158 R, 158 D, 158 T, 324/110; 361/93, 98, 100, 101, 102; 371/4

[56] References Cited

U.S. PATENT DOCUMENTS 3,371,276 2/1968 Schiff .............................. 324/158 R
4,731,691 3/1988 Padwa .................................... 361/93

*Primary Examiner*—Reinhard J. Eisenzopf
*Assistant Examiner*—Edward Urban
*Attorney, Agent, or Firm*—Burgess, Ryan & Wayne

[57] ABSTRACT

A stimulus generator comprising a single-shot pulse generator, a measuring resistor, a differential amplifier, and a gated comparator to identify the moment of onset of a mismatch between the patterns of current and voltage variation in the output electric signal, this mismatch being caused by the onset of a thermal breakdown in the circuit under test.

1 Claim, 3 Drawing Sheets

STIMULUS GENERATOR

FIELD OF THE INVENTION

The invention relates to the field of pulse engineering, in particular to pulse shapers and more specifically to stimulus generators.

The invention may be used in monitoring and diagnostic equipment for digital circuit testing.

BACKGROUND OF THE INVENTION

Known in the art if a stimulus generator (V.A. Myasnikov et al., Microprocessors in programming and debugging systems. —Energoatmomizdat, Moscow, 1985, pp. 58–60) containing a programmable generator of short pulses whose input is driven from a control bus and whose output is connected to a boltage converter which is loaded by the circuitry under test.

The known stimulus generator features a low probability of generating a pulse in the circuit under test, which would provide safety of the components of the circuit under test. This is due to restrictions placed on the duration of the output electric pulses to avoid thermal breakdown in the circuitry components, which would cause a failure of the object under test.

The nearest in spirit to the invention is the stimulus generator (Bydanov el al., Logic circuit tester.—Radio, N° 11, (Moscow), 1977pp. 28, 29) which contains a single-shot pulse generator triggered from a control bus, and a probe connected to the single-shot pulse generator via a voltage converter.

The known stimulus generator does not provide adaptability of the output electric signal to the parameters of the circuit under test in the selected test point. Due to this the duration of output electric pulses has to be restricted to avoid thermal breakdown in the components of the circuit under test. In such a case it is impossible to ensure a high probability of generating in the circuit under test of a pulse which would guarantee the safety of the circuit components.

SUMMARY OF THE INVENTION

An objective of the invention is to improve the probability of inducing a pulse in the circuit under test, which provides safety of the circuit component under test by generating an initial pulse of a duration known to be in excess of that maximally allowable while simultaneously protecting the circuit under test from overload.

The nature of the invention is a stimulus generator comprising: a single-shot pulse generator producing the initial signal and triggered from a control bus which determines the leading edge of the initial pulse; a probe to directly insert the stimulus generator output pulse into a selected point of the circuit under test, and according to the invention additionally contains: a measuring resistor to detect the pattern of the output electric signal current variation when reversible electric breakdown of the p-n junction in the circuit component under test develops into an irreversible thermal breakdown, with the first lead of the resistor connected to the probe; a differential amplifier to amplify the voltage drop across the said measuring resistor of the stimulus generator with the first and second differential amplifier inputs connected to the first and second leads of the measuring resistor, respectively; and a gated comparator to detect the moment of mismatch between the pattern of current variation registered by the differential amplifier and the pattern of output electric signal voltage with the first comparator input connected to the single-shot pulse generator ouput, the second comparator input connected to the differential amplifier output, and the third comparator input connected to the first lead of the measuring resistor.

The invention improves the validity of testing digital equipment by inducing in any point of the equipment a pulse shaped externally relative to the equipment under test, while ensuring the presence of this test pulse on the one hand, and the safety of the equipment under test on the other hand.

BRIEF DESCRIPTION OF ACCOMPANYING DRAWINGS

The invention will now be explained with reference to a specific embodiment and the accompanying drawings, wherein.

DETAILED DESCRIPTION OF THE INVENTION

Figure 1:
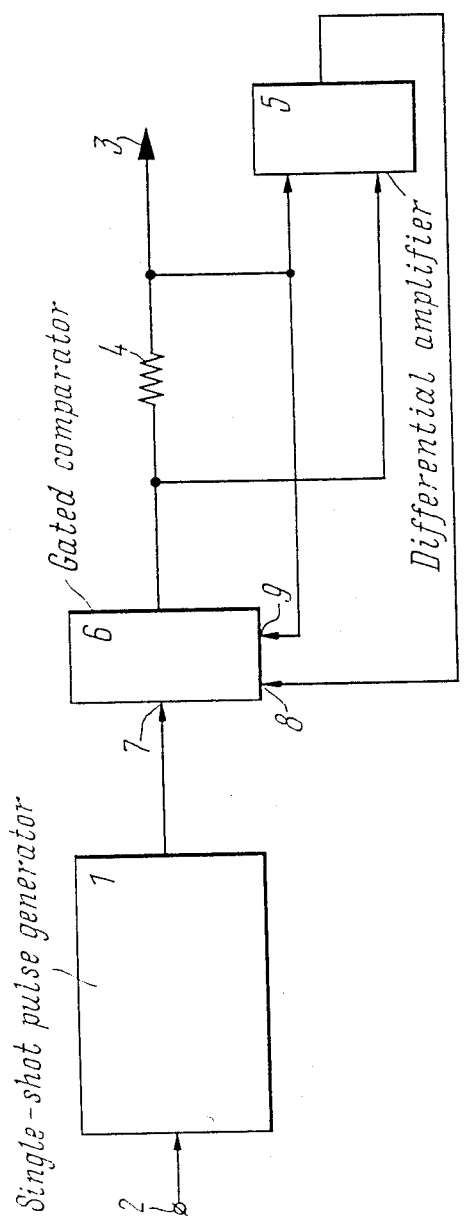
FIG. 1 is a skeleton diagram of the stimulus generator of the invention.

The stimulus generator comprises a single-shot generator 1 (FIG. 1) intended to provide the initial signal, with the generator triggering input connected to control bus 2 which sets the starting moment of initial signal generation, a probe 3 designed to directly introduce the output signal of the stimulus generator into the selected point of the circuit under test (not shown), a measuring resistor 4 to detect the pattern of current changes when the self-healing electric breakdown of the p-n junction in the circuit component under test develops into an irreversible thermal breakdown, with the first lead of this measuring resistor connected to probe 3, differential amplifier 5 to amplify the voltage drop across the measuring resistor 4 of the stimulus generator with first and second amplifier 5 inputs connected respectively to the first and second leads of measuring resistor 4, and grated comparator 6 to detect the moment when the pattern of current variations registered by differential amplifier 5 differs from the pattern of the output electric signal voltage with comparator 6 input 7 connected to the output of single-shot pulse generator 1, comparator 6 input 8 connected to the output of differential amplifier 5, and comparator 6 input 9 connected to the first lead of measuring resistor 4.

Figure 3:
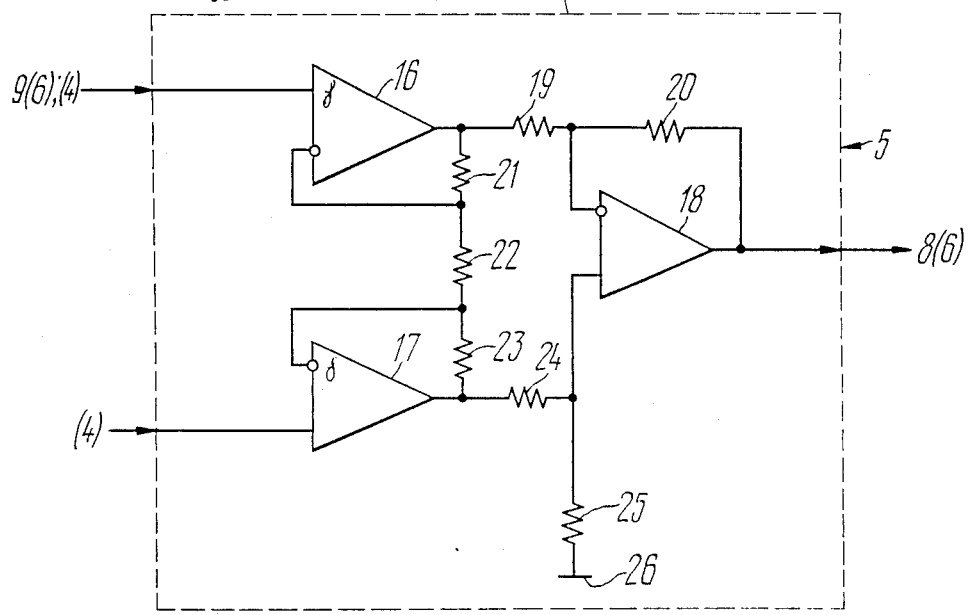
FIG. 3 is a schematic diagram of the differential amplifier of the invention.
Figure 2:
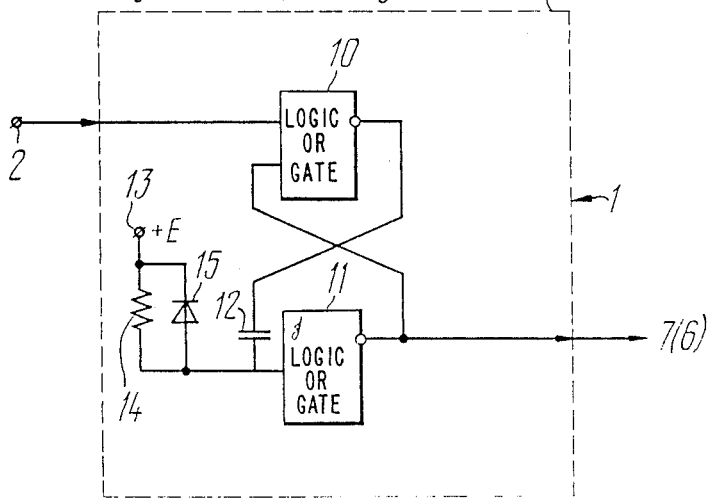
FIG. 2 is a schematic diagram of the single-shot pulse generator of the invention.

The single-shot pulse generator is a monostable multivibrator designed with logic OR gates 10, 11 (FIG. 2) and capacitor 12 connected between the output of logic OR gate 10 and the input of logic OR gate 11. The input of logic OR gate 11 is connected to voltage supply 13 via resistor 14 and diode 15 connected in parallel. The control bus 2 is connected to the first input of logic OR gate 10 while the output of logic OR gate 11 is connected to the second of logic OR gate 10 and to input 7 of 'gated compatator 6. Differential amplifier 5 is designed as a potentiometric amplifier (electrometric subtractor) with operational amplifiers 16, 17, 18 (FIG. 3) and resistors 19, 20, 21, 22, 23, 24, 25. the output of operational amplifier 16 is connected to its inverting input and to the first lead of resistor 22 via resistor 21 and to the inverting input of operational amplifier 18 via resistor 19. The output of operational amplifier 17 is connected to its inverting input and to the second lead of resistor 22 via resistor 23 and to the non-inverting input of operational amplifier 18 via resistor 24. The output of operational amplifier 18 is connected to its inverting input and to gated comparator 6 input 8 via resistor 20. The non-inverting input of operational amplifier 18 is connected to the zero voltage bus 26 via resistor 25.

The non-inverting inputs of operational amplifiers 16, 17 are connected respectively to the first lead of measuring resistor 4 and to the output of gated comparator. 6.

The gated comparator 6 provides comparison of differentiated input signals arriving at its inputs 8, 9 during the time that its input 7 is driven by the initial signal. The gated comparator 6 comprises operational amplifier 27 (FIG. 4) which serves as the first differentiating stage with resistors 28, 29, 30 and capacitor 31, and operational amplifier 32 which constitutes the second differentiation stage with resistors 33, 34, 35 and capacitor 36.

Gated comparator 6 also contains a first null-indicator designed with operational amplifier 37, resistors 38, 39, 40, 41 and diodes 42, 43, 44, and second null-indicator designed with operational amplifier 45, resistors 46, 47, 48, 49 and diodes 50, 51, 52.

Besides this, gated comparator 6 contains a potentiometric amplifier (electrometric subtractor) designed with operational amplifiers 53, 54, 55 and resistors 56, 57, 58, 59, 61, 62. The non-inverting input of operational amplifier 53 is connected to input 8 via the first null-indicator and first differentiating stage connected in series. The non-inverting input of operational amplifier 54 is connected to input 9 via the second null-indicator and second differentiating stage connected in series. The output of operational amplifier 55 drives the gated comparator 6 output via an inverter designed with operational amplifier 63 and resistors 64, 65, 66. Gated comparator 6 input 7 is connected to supply inputs of operational amplifiers 27, 32, 37, 45, 53, 54, 55, 63.

Figure 4:
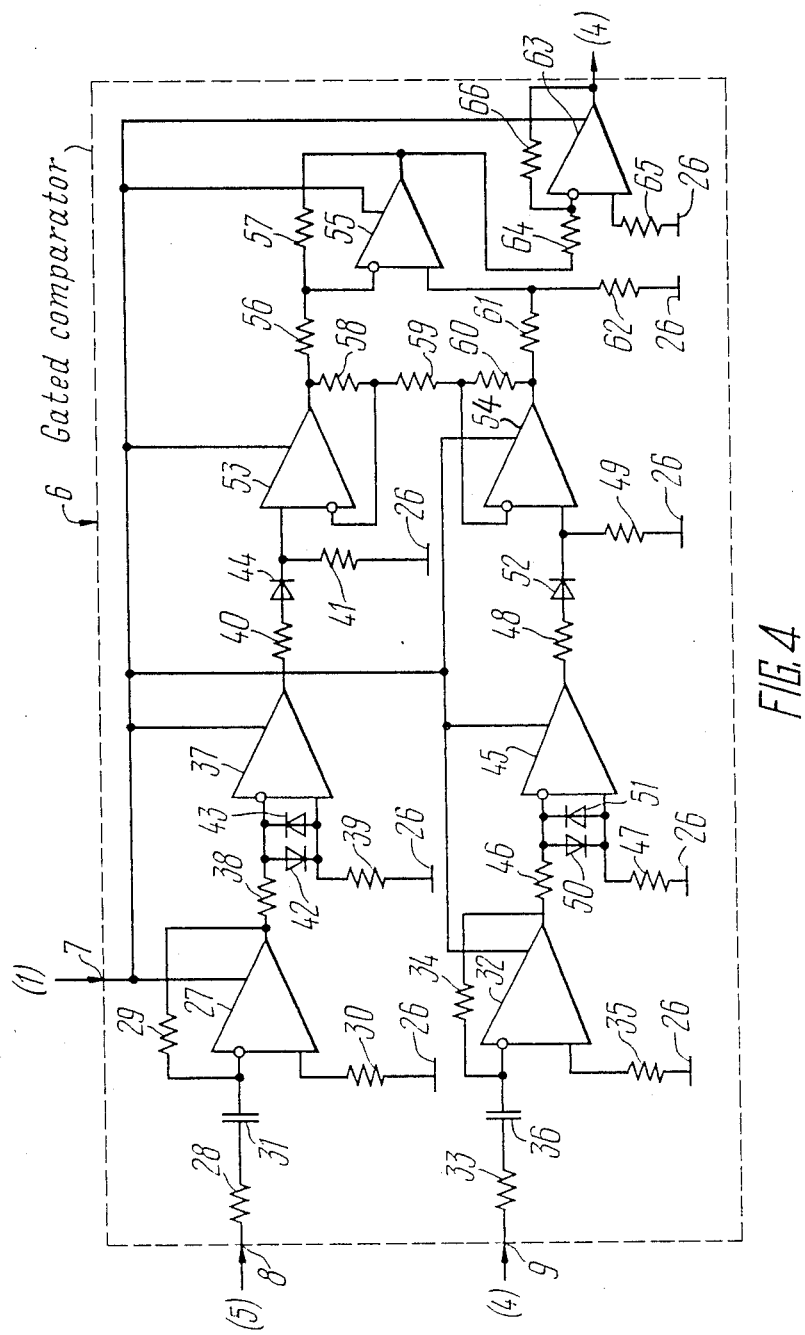
FIG. 4 is a schematic diagram of the gated comparator of the invention.

The stimulus generator functions as follows. At the initial moment of time the control bus (FIG. 2) is at a low signal level (0 to 0.7 V) and this sets the single-shot pulse generator 1 output to a low voltage which is inadequate to drive the gated comparator 6 (FIG. 4). Therefore a low voltage level is set at the gated comparator 6 output (FIG. 1) and probe 3. Generation of the stimulus pulse in the circuit under test effected by an output electric signal of the stimulus generator is initiated by a control pulse from bus 2 at the input of the single-shot pulse generator 1. This control pulse triggers single-shot pulse generator 1 to output the initial signal whose duration is selected to exceed the maximally allowable duration of the test signal which, if applied to the circuit under test, would cause a thermal breakdown of the p-n junction in a circuit component under test and thus result in circuit failure. This initial signal is applied to input 7 of gated comparator 6 and enables the comparator. In the absence of ohmic contact between probe 3 and the circuit under test, input 9 of gated comparator 6 is at a low voltage level and input 8 is at a high voltage level since there is no output electric signal.

This sets the output of gated comparator 6 to a high signal level (in stimulus generators designed to test transistor-transistor logic (TTL) circuitry or Schottky transistor-transistor logic (STTL) circuitry this level constitutes some 10 V to 12V). When probe 3 is brought into contact with the circuit under test a high signal level is set on inputs 8 and 9 of gated comparator 6, this maintaining the initial state at the output of the gated comparator 6.

The output signal of the stimulus generator begins to affect the circuit under test when probe 3 of the stimulus generator contacts this circuit in the selected test point. An output electric signal of high level causes an electric breakdown of the p-n junction of the component under test, thus, ensuring guaranteed switching. Further develoment of the self-healing breakdown of the p-n junction into a thermal breakdown may cause a failure of the circuit component under test. Thermal breakdown features an S-shaped voltampere characteristic so that a drop in voltage is accompanied by a rise in current. The pattern of the output electric signal current and voltage variations during the entire period of its action on the circuit under test is tracked by gated comparator 6. The pattern of output electric signal voltage variations is determined by its instantaneous value arriving at input 9 via the feedback network; the pattern of output electric signal variations is analyzed with the aid of measuring resistor 4 and differential amplifier 5 whose output signal drives input 8 of gated comparator 6. The output electric signal affects the circuit under test until thermal breakdown begins to set in, i.e. until the voltage at input 9 of the gated comparator begins to fall off while the voltage at input 8 begins to rise. This identifies the moment of mismatch in the behaviour of output electric signal voltage and current variations and in this case the output voltage of gated comparator 6 falls off, thus ensuring safety of the circuit component under test. Thus, the effect of the output electric signal of the stimulus generator on the circuit under test acquires an adaptive nature sincen its parameters are automatically brought into correspondence with those of the circuit under test in the selected test point. At the same time, a high probability of inducing a stimulating pulse in the circuit under test is ensured in that the output electric signal which shapes this stimulating pulse features an amplitude and duration that are maximmally allowable in the specific test point, while the safety of components of the circuit under test is ensured by its protections against overload at the moment of thermal breakdown onset.

The probability of inducing a stimulating pulse is further increased by eliminating misoperation due to probe 3 having a poor contact with the selected test point, at which an arc or glow discharge may induce a considerable noise component in the input networks of the circuit component under test. Both arc and glow discharges feature an S-shaped or N-shaped voltampere characteristic and therefore a mismatch in the patterns of current and voltage variations will cause a reduced output voltage of gated comparator 6 (and therefore, on probe 3), this extinguishing the arc or glow discharge and excluding both misoperation of the circuit component under test and generation of interference (chatter) signals.

The invention improves the validity of test results by generating a stimulating pulse of maximally allowable in each specific test point duration, while at the same time protecting the circuit under test against overloads (due to thermal breakdown).

An improved validity test significantly increases the efficiency of adjustment and diagnostic operations, primarily those concerned with sophisticated equipment where the probability of damaging a circuit component or erroneous rejection of a fit integrated circuit should be minimized.

What is claimed is:

1. A stimulus generator intended to induce a stimulating pulse in a selected point of the circuit under test by means of an output electric signal of this generator, with the pulse voltage level adaptable to variations of electric parameters of the circuit under test, these variations evidenced during transistion of reversible (self-healing) electric breakdown of a p-n junction to an irreversible thermal breakdown of the junction, and comprising:

single-shot pulse generator means for generating an initial signal which sets a maximally possible duration of an operational cycle of the stimulus generator, said single-shot pulse generator means being equipped with a trigger signal input and an output;

control bus means for setting the start of generation of the initial signal;

probe means for directly introducing said output electric signal of the stimulus generator into the selected point of the said circuit under test;

measuring resistor means for detecting a pattern of current variations of the output electric signal of the stimulus generator during transistion from a self-healing electric breakdown of the p-n junction of a component of the circuit under test to an irreversible thermal breakdown of this junction, said measuring resistor means provided with first and second leads, with said first lead of said measuring resistor means connected to said probe means;

differential amplifier means for amplifying a voltage drop across said measuring resistor means, said amplifier means provided with first and second inputs and an output, with said first input of said differential amplifier means connected to said first lead of said measuring resistor means, and said second input of said differential amplifier means connected to said second lead of said measuring resistor means; and gated comparator means for identifying the moment of onset of mismatch between the patterns of variation of current and voltage of the output signal of the stimulus generator, these patterns being registered by said differential amplifier means, said gated comparator means being provided with first, second, and third inputs and an output, with said first input of said gated comparator means connected to said output of the single-shot pulse generator means, said second input of said gated comparator means connected to said output of said differential amplifier means, said third input of said gated comparator means connected to said first lead of said measuring resistor means, and said output connected to the second lead of said measuring resistor means, so that the output is connected to said circuit under test through said measuring resistor means.

* * * * *